(12) United States Patent
Thiruvengadam et al.

(10) Patent No.: US 10,861,573 B2
(45) Date of Patent: Dec. 8, 2020

(54) TRIM SETTING DETERMINATION FOR A MEMORY DEVICE

(71) Applicant: Micron Technology, Inc., Boise, ID (US)

(72) Inventors: Aswin Thiruvengadam, Folsom, CA (US); Daniel L. Lowrance, El Dorado Hills, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/591,686

(22) Filed: Oct. 3, 2019

(65) Prior Publication Data

US 2020/0035318 A1 Jan. 30, 2020

Related U.S. Application Data

(62) Division of application No. 15/802,597, filed on Nov. 3, 2017, now Pat. No. 10,535,415.

(51) Int. Cl.
*G11C 29/00* (2006.01)
*G11C 29/02* (2006.01)
*G06F 12/02* (2006.01)
*G11C 16/10* (2006.01)
*G11C 29/44* (2006.01)

(52) U.S. Cl.
CPC ........ *G11C 29/028* (2013.01); *G06F 12/0246* (2013.01); *G06F 12/0292* (2013.01); *G11C 16/10* (2013.01); *G06F 2212/7207* (2013.01); *G11C 2029/4402* (2013.01)

(58) Field of Classification Search
CPC .... G11C 29/028; G11C 16/10; G06F 12/0246
See application file for complete search history.

(56) References Cited

U.S. PATENT DOCUMENTS

| 2007/0223278 | A1 | 9/2007 | Aritome |
| 2009/0316486 | A1 | 12/2009 | Aritome |
| 2012/0182803 | A1 | 7/2012 | Shirakawa |
| 2012/0230109 | A1 | 9/2012 | Tsai et al. |
| 2013/0044546 | A1* | 2/2013 | Marquart ............ G11C 29/028 365/185.18 |
| 2013/0275660 | A1 | 10/2013 | Bennett |
| 2014/0160869 | A1 | 6/2014 | He et al. |

(Continued)

OTHER PUBLICATIONS

International Search Report and Written Opinion from related international application No. PCT/US2018/058876, dated Feb. 20, 2019, 13 pages.

*Primary Examiner* — Alfredo Bermudez Lozada
(74) *Attorney, Agent, or Firm* — Brooks, Cameron & Huebsch, PLLC

(57) ABSTRACT

Apparatuses and methods related to a memory system including a controller and an array of memory cells. An example apparatus can include a controller configured to receive operational characteristics of an array of memory cells based on prior operations performed by the array of memory cells, determine a set of trim settings for the array of memory cells based on the operational characteristics of the array of memory cells, wherein the set of trim settings are associated with desired operational characteristics for the array of memory cells, and send the set of trim settings to the array of memory cells.

20 Claims, 3 Drawing Sheets

(56) References Cited

U.S. PATENT DOCUMENTS

| | | | |
|---|---|---|---|
| 2014/0181426 A1* | 6/2014 | Grunzke | G06F 12/0246 711/154 |
| 2015/0092469 A1 | 4/2015 | Kim et al. | |
| 2015/0234603 A1 | 8/2015 | Kitagawa et al. | |
| 2015/0324148 A1 | 11/2015 | Achtenberg et al. | |
| 2016/0117112 A1 | 4/2016 | Tomlin | |
| 2016/0179406 A1 | 6/2016 | Gorobets et al. | |
| 2017/0160989 A1 | 6/2017 | Hsieh et al. | |

* cited by examiner

TRIM SETTING DETERMINATION FOR A MEMORY DEVICE

PRIORITY INFORMATION

This application is a Divisional of U.S. application Ser. No. 15/802,597, filed on Nov. 3, 2017, the contents of which are incorporated herein by reference in its entirety.

TECHNICAL FIELD

The present disclosure relates generally to memory systems, and more particularly, to apparatuses and methods to determine trim settings for a memory device.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
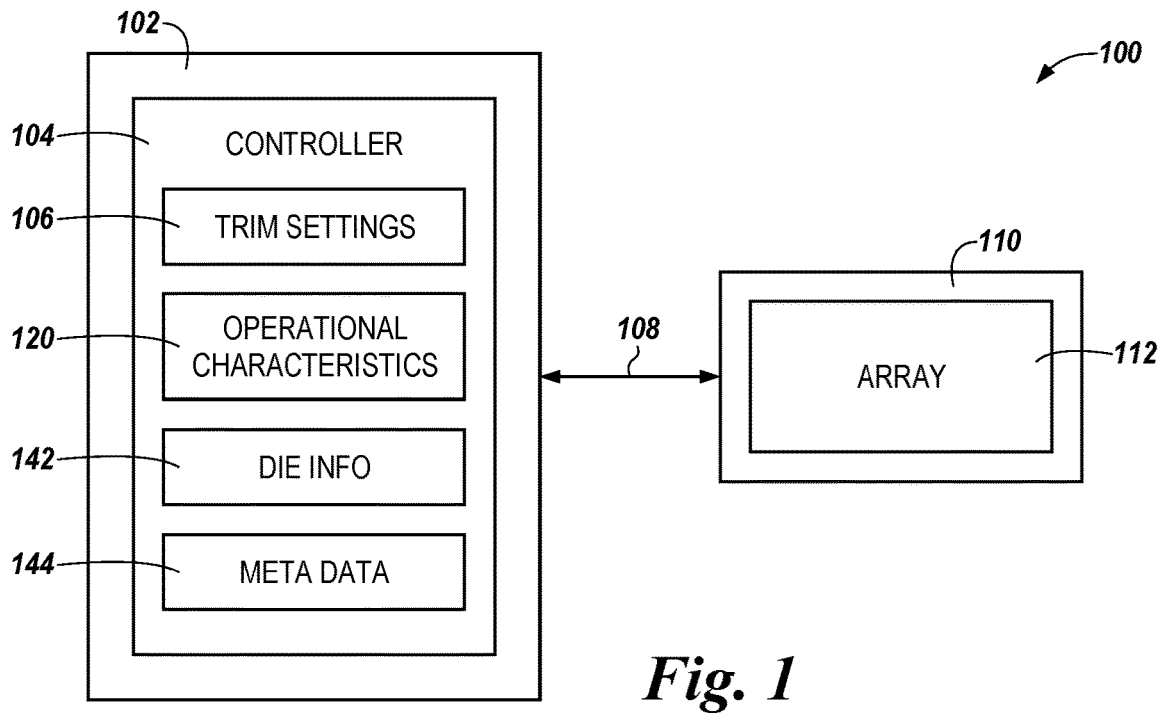
FIG. 1 is a block diagram of a computing system including an apparatus in the form of a host and an apparatus in the form of memory system in accordance with one or more embodiments of the present disclosure.

The present disclosure includes apparatuses and methods related to determining trim settings for a memory device. An example apparatus can include a computing system with a controller configured to receive operational characteristics of an array of memory cells based on prior operations performed by the array of memory cells, determine a set of trim settings for the array of memory cells based on the operational characteristics of the array of memory cells, wherein the set of trim settings are associated with desired operational characteristics for the array of memory cells, and send the set of trim settings to the array of memory cells.

In a number of embodiments, the computing system can be coupled via a wireless network to the memory device. Also, the memory device can part of the computing system and an application can be executed by the controller to determine trim settings for the memory device and/or memory devices that are part of the computing system.

The controller can receive operational characteristics in response to requesting the operational characteristics. For example, the operational characteristics can indicate the array of memory cells is storing static data. Accordingly, the trim settings can be configured for static data and sent back to the array of memory cells. In a number of embodiments, the operational characteristics can indicate the array of memory cells is storing dynamic data. Accordingly, the trim settings can be configured for dynamic data and sent back to the array of memory cells.

In a number of embodiments, the controller can communicate with a first array of memory cells and a second array of memory cells via a first communication channel. The communication channel can be via a wireless network, for example. The second array of memory cells can have similar and/or the same operational characteristics as the first array of memory cells. Arrays of memory cells with similar and/or the same operational characteristics can be in a group. The arrays of the memory cells in the group can be in the same geographic location or can be in different geographic locations. The controller can determine a first set of trim settings based on the operational characteristics of the first array of memory cells and/or the second array of memory cells. The controller can send the first set of trim settings to the first and/or second array of memory cells.

In a number of embodiments, the controller can communicate with a third array of memory cells and a fourth array of memory cells with similar and/or the same operational characteristics. The controller can determine a second set of trim settings based on the operational characteristics of the third array of memory cells and/or the fourth array of memory cells. The second set of trim settings can be different from the first set of trim settings. The controller can send the second set of trim settings to the third and/or fourth array of memory cells.

In a number of embodiments, the controller can receive manufacturing characteristics. The manufacturing characteristics can be received from a manufacturer, for example. The manufacturing characteristics can include data collected during manufacturing of the array of memory cells. The controller can determine trim settings based on the manufacturing data of the array of memory cells. The controller can send the trim settings based on the manufacturing data to the array of memory cells and/or arrays of memory cells with similar manufacturing characteristics.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "L", "M", "N", "W", "X", and "Y", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 102 may reference element "2" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

FIG. 1 is a functional block diagram of a system 100 including an apparatus in the form of computing device 102 and an apparatus in the form of a memory device 110, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, computing device 102 can include a controller 104, which can communicate with memory device 110 via communication channel 108. Memory device 110 can include array 112, which can include volatile memory and/or non-volatile memory.

Controller 104 and/or a controller on memory device 110 can include control circuitry, e.g., hardware, firmware, and/or software. In one or more embodiments, controller 104 and/or a controller on memory device 110 can be an application specific integrated circuit (ASIC) coupled to a printed circuit board including a physical interface. System 100 can include a non-transitory computer-readable storage medium can store instructions that are executed by controller 104 and/or a controller on memory device 110 to determine trim settings for a memory device as described herein.

Memory device 110 can provide main memory for the system 100 or could be used as additional memory or storage throughout the system 100. System 100 can include memory device 110 and/or a number of memory devices, where each memory device can include one or more arrays of memory cells 112, e.g., non-volatile and/or volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and/or flash memory, among others.

The embodiment of FIG. 1 can include additional circuitry that is not illustrated so as not to obscure embodiments of the present disclosure. For example, the memory system 102 can include address circuitry to latch address signals provided over I/O connections through I/O circuitry. Address signals can be received and decoded by a row decoder and a column decoder to access the memory device 110. It will be appreciated by those skilled in the art that the number of address input connections can depend on the density and architecture of the memory device 110.

In a number of embodiments, controller 104 can include registers, buffers, and/or memory to store trim settings 106, operational characteristics 120 of the memory device 110, die info 142 for the array 112, and metadata 144 for the data in memory device 110. Trim settings 106 can include a number of parameters that can control the operation and performance of the memory device 110. For example, the trim settings can include parameters such as the programming signal magnitude (e.g., voltage and/or current level), erase signal magnitude (e.g., voltage and/or current level), sensing signal magnitude (e.g., voltage and/or current level), programming signal length, erase signal length, sensing signal length, number of bits per cells, number of programming signals in a programming operation, number of sensing signals in a sensing operation, and/or allowable programming operation rate for a memory device. Trim settings can include a number of settings for each of the number of parameters.

The trim settings can control the operational characteristics of the memory device 110. The operational characteristics of the memory device can include life span of the memory device 110, data retention characteristics for the data in the memory device 110, the storage density (e.g., the number of bits stored) for the memory device 110, disturb characteristics for the data in the memory device 110, programming speed for the memory device 110, power consumption for the memory device 110, sensing speed for the memory device 110, operation temperature for the memory device 110, and/or programming operation rate for the memory device 110, among other operational characteristics. The memory device 110 can be monitored by the controller 104 and the operational characteristics 120 of the memory device 110 stored on controller 104 can include the monitored operation characteristics. Also, the operational characteristics 120 stored on controller 104 can include desired operational characteristics. Desired operational characteristic can be input to the controller 104 from a host and/or be determined by controller 104 based on the monitored operational characteristics of memory device 110.

In a number of embodiments, trim settings 106 can include a number of configurations of trim setting parameters that can control the operational characteristics of the memory device 110. A trim setting configuration can include setting each of the number of trim setting parameters at particular levels to provide particular operational characteristics for memory device 110. A particular trim setting configuration can be associated with particular operational characteristics for a memory device. A trim setting configuration used to operate memory device 110 can be based on monitored and/or desired operational characteristics 120 for memory device 110, die info 142 for the array 112, and/or metadata 144 for the data in memory device 110.

Trim settings 106 on controller 104 can include a look up table that includes a number of trim setting configurations. Also, trim settings 106 in controller 104 can include trim setting configurations determined by performing an algorithm that calculates trim setting configurations for memory device 110 based on monitored and/or desired operational characteristics 120 for memory device 110, die info 142 for the array 112, and/or metadata 144 for the data in memory device 110. A particular trim setting configuration of the number of trim setting configurations in trim settings 106 can be sent to memory device 110 and used by memory device 110 during operation to provide operational characteristics for memory device 110 associated with the particular trim setting configuration.

A trim setting configuration used by memory device 110 can control the operational characteristics of memory device 110 such that memory device 110 can perform with desired operational characteristics and/or closer to the desired operational characteristics than prior operational characteristics of memory device 110.

The operational characteristics of memory device 110 can be controlled by the trim setting parameters in trims settings 106. For example, the operational characteristic of life span for memory device 110 can be dependent on trim setting parameters such as the allowable programming operation rate and programming signal magnitude, for example. The life span of memory device 110 can be dependent on the allowable programming operation rate (e.g., the number of programming operations performed over a period of time) and the programming signal magnitude because a memory device has a finite number of times the memory cells of the memory device can be programmed before the memory cells fail, which in turn can be dependent on the magnitude of the programming signal used to program the memory cells. Therefore, the trim setting parameters for memory device 110 can include setting the allowable programming operation rate at a particular number of programming operations per minute to allow the memory device to have a particular life span based on prior operational characteristics of the memory device, prior trim setting configurations used by the memory device, and/or desired operational characteristics of the memory device.

Figure 2:
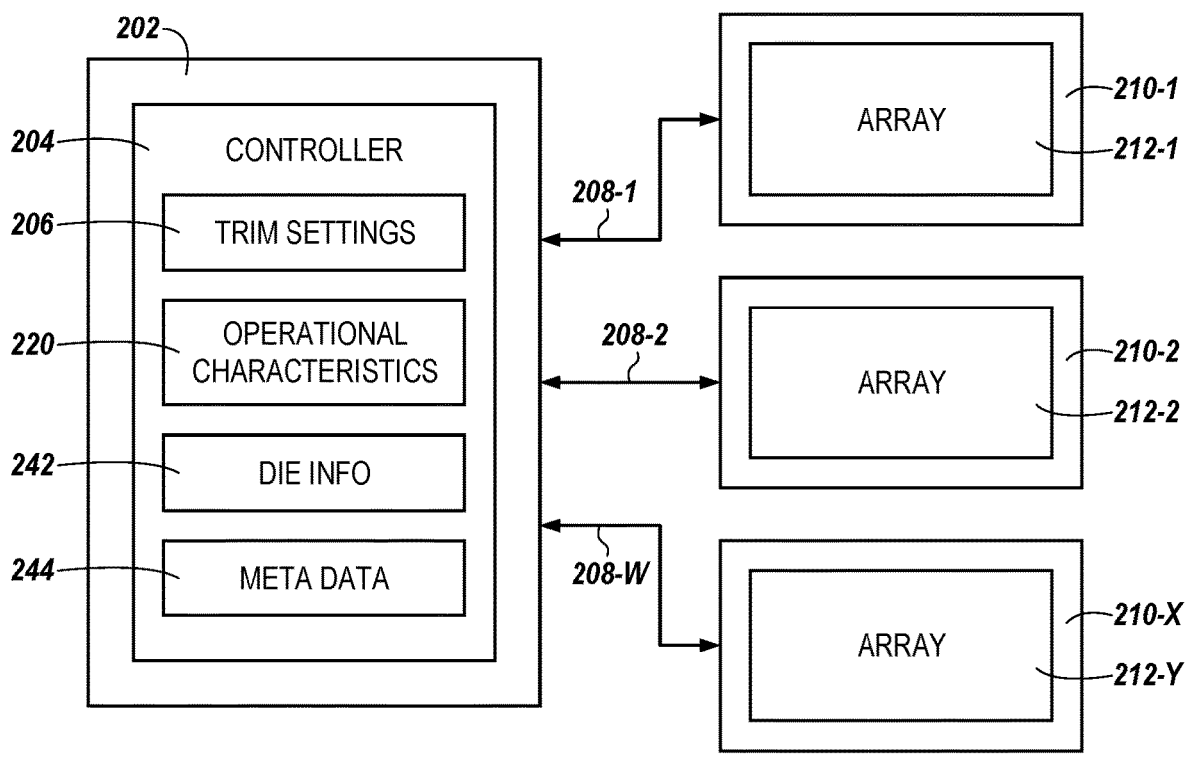
FIG. 2 is a block diagram of an apparatus in the form of a memory system in accordance with a number of embodiments of the present disclosure.

FIG. 2 is a block diagram of an apparatus in the form of a memory system 202 and a number of memory devices 210-1, . . . , 210-X in accordance with a number of embodiments of the present disclosure. In FIG. 2, the memory system 202 can include a controller 204. The controller 204 can include registers, buffers, and/or memory to store trim settings 206, operational characteristics 220, die info 242, and meta data 244 for the data in the memory devices 210-1, . . . , 210-X. Each of the memory devices 210-1, . . . , 210-X can include an array 212-1, . . . , 212-Y.

The controller 204 can communicate with the memory devices 210-1, . . . , 210-X via communication channels 208-1, . . . , 208-Y.

The memory system 202 can be in a same or different location than the memory devices 210-1, . . . , 210-X. For example, the memory system 202 can be in a different part of a building, a different state, or a different country than the memory devices 210-1, . . . , 210-X. The memory system 202 can belong to a manufacturer of the arrays 210-1, . . . , 210-Y, the manufacturer of the memory devices 210-1, . . . , 210-X, or the user of the memory devices 210-1, . . . , 210-X, for example. The memory devices 210-1, . . . , 210-X can also be in the same or different locations from each other. For example, the memory device 210-1 can be in a different part of a building, a different state, or a different country than memory device 210-2. Memory device 210-1 can belong to a first user and memory device 210-2 can belong to a second user, for example.

The controller 202 can include control circuitry configured to receive operational characteristic 220 of the arrays 212-1, . . . , 212-Y based on prior operations performed by the arrays of memory cells. The controller 202 can determine a set of trim settings 206 for the arrays 212-1, . . . , 212-Y based on the operational characteristics 220 of the arrays 212-1, . . . , 212-Y. The trim settings 206 can be associated with desired operational characteristics for the arrays 212-1, . . . , 212-Y and the controller 202 can send the trim settings 206 to the arrays 212-1, . . . , 212-Y.

In a number of embodiments, the arrays 212-1, . . . , 212-Y can have operational characteristics 220 of static data. In such instances, the controller 204 can send trim settings 206 to the arrays 212-1, . . . , 212-Y configured to provide desired data retention characteristics for static data. In a number of embodiments, the arrays 212-1, . . . , 212-Y can have operational characteristics 220 of dynamic data. In such cases, the controller 204 can send trim settings 206 to the arrays 212-1, . . . , 212-Y configured to provide desired programming speed characteristics for dynamic data.

In a number of embodiments, the controller 202 can receive operational characteristics 220 of the arrays 212-1, . . . , 212-Y periodically. For example the controller 202 can receive operational characteristics 220 from the array 212-1 every week and operational characteristics 220 from the array 212-2 every month. Then the controller 204 can send trim settings 206 back to the arrays 212-1, . . . , 212-Y that are configured for each arrays 212-1, . . . , 212-Y operational characteristics.

Figure 3:
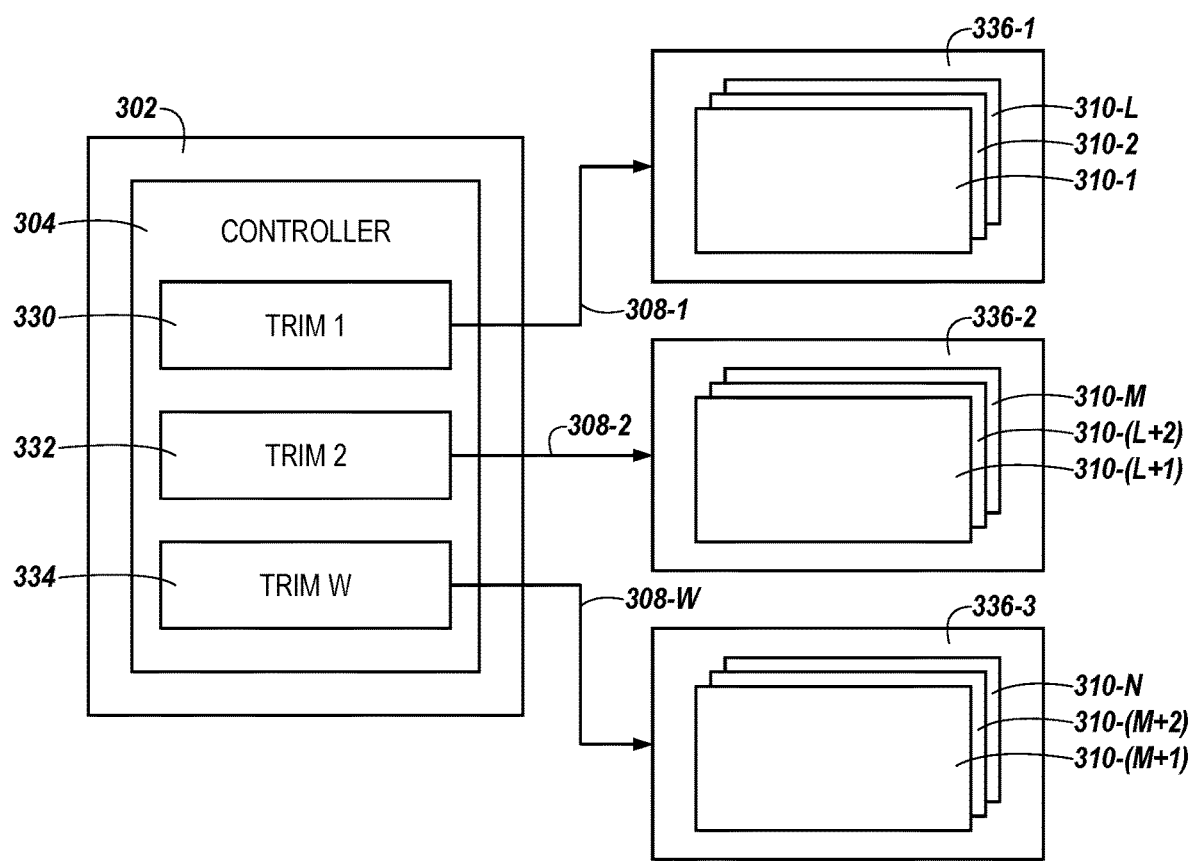
FIG. 3 is a block diagram of an apparatus in the form of a memory system in accordance with a number of embodiments of the present disclosure.

FIG. 3 is a block diagram of an apparatus in the form of a memory system 302 and a number of groups 336-1, . . . , 336-W in accordance with a number of embodiments of the present disclosure. In FIG. 3, the memory system 302 can include a controller 304. The controller 304 can include registers, buffers, and/or memory to store trim settings including trim 1 330, trim 2 332, and trim W 334. The number of groups 336-1, . . . , 336-W can include a number of memory devices 310-1, . . . , 310-N. The controller 304 can communicate with the memory devices 310-1, . . . , 310-N via communication channels 308-1, . . . , 308-W.

The number of memory devices 310-1, . . . , 310-N can be grouped based on similar operational characteristics. The memory devices 310-1, . . . , 310-N can be located in the same geographical location and/or a different geographic location and be in the same group. For example, memory devices 310-1, . . . , 310-L can be located in different countries, but be in group 336-1 because they all have similar operational characteristics, e.g. static data and/or dynamic data. Since memory devices 310, . . . , 310-L have the same and/or similar operational characteristics, the controller 304 can send the trim 1 settings 330 to the group 336-1 via the communication channel 308-1.

In a number of embodiments, the controller 304 can receive operational characteristics from the memory device 310-M from a group 310-L+1. The controller 304 can determine trim settings 332 based on the operational characteristics of the memory device 310-M. The controller 304 can send the trim settings 332 to the group 336-2 including the memory devices 310-L+1, . . . , 310-M even though the trim settings 332 were determined by the operational characteristics of memory device 310-M, the other memory devices in group 336-2 have similar and/or the same operational characteristics as memory device 310-M.

Figure 4:
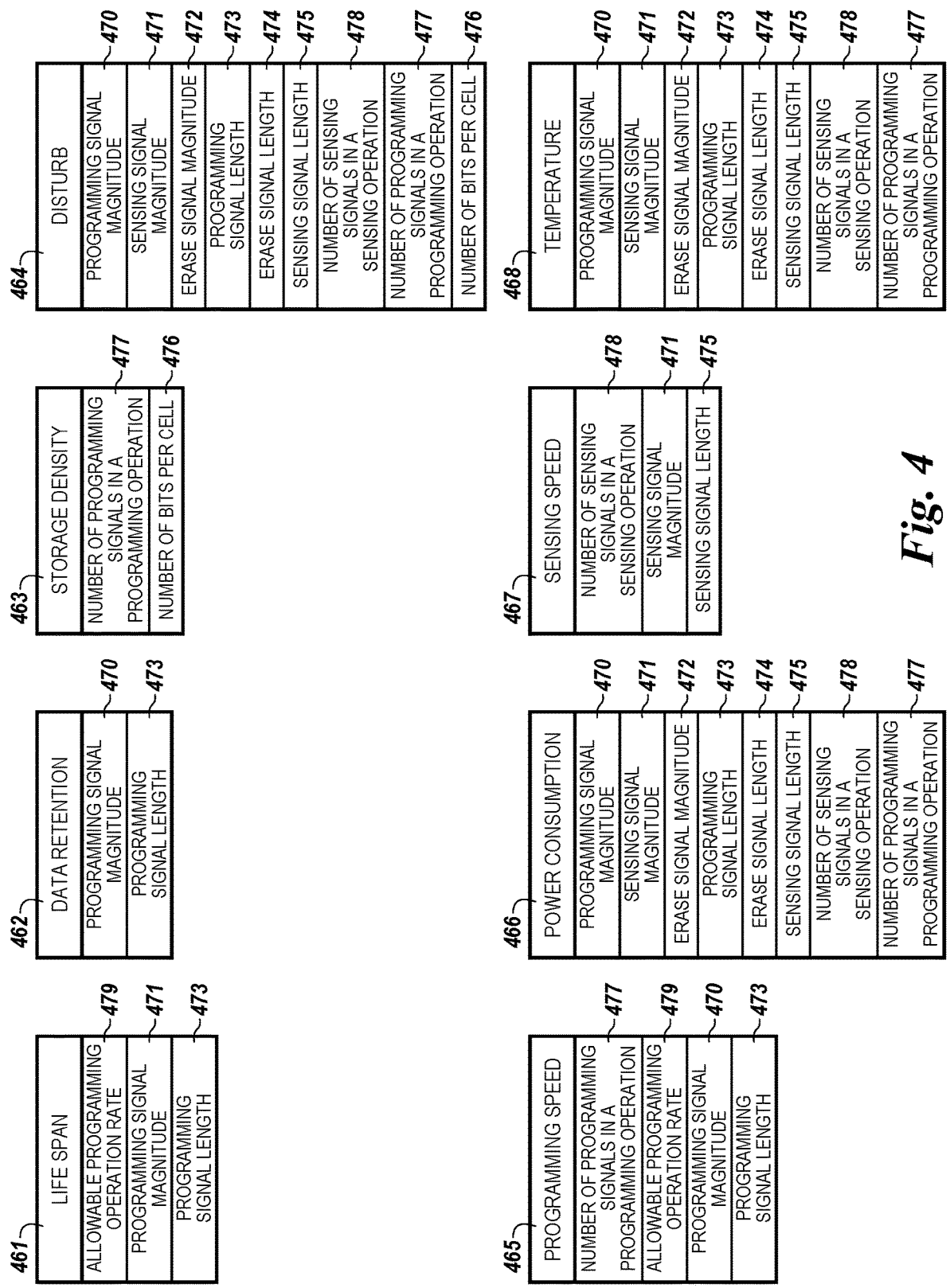
FIG. 4 is a diagram including tables with trim setting parameters associated with operational characteristics of a memory device in accordance with a number of embodiments of the present disclosure.

FIG. 4 is a diagram including tables with trim setting parameters associated with operational characteristics of a memory device in accordance with a number of embodiments of the present disclosure. In FIG. 4, the operational characteristics of a memory device include life span 461, data retention 462, storage density 463, disturb characteristics 464, programming speed 465, power consumption 466, sensing speed 467, and temperature 468. The operational characteristics in FIG. 4, among other operational characteristics, can be affected and/or controlled by trim setting parameters. In FIG. 4, the trim setting parameters associated with operational characteristics of a memory device include programming signal magnitude 470, sensing signal magnitude 471, erase signal magnitude 472, programming signal length 473, erase signal length, 474, sensing signal length 475, number of bits per cell 476, number of programming signals in a programming operation 477, number of sensing signals in a sensing operation 478, and allowable programming operation rate 479. Embodiments of the present disclosure are not limited to the trim setting parameters in FIG. 4 and can include other trim setting parameters that are associated with operational characteristics of a memory device.

In FIG. 4, life span 461 of a memory device can be associated with the allowable programming operation rate 479, the programming signal magnitude 471, and programming signal length. Memory cells of memory devices can be programmed a finite number of times before they will fail. The number of times memory cells can be programmed is also associated with the magnitude and duration of the programming signals used to the program the memory cells. Trim setting configurations can include setting an allowable programming operation rate 479, along with the programming signal magnitude 471 and programming signal length to affect the life span 461 of the memory device.

In FIG. 4, data retention 462 in a memory device can be associated with the programming signal magnitude 471 and programming signal length. Data retention 462 in a memory device is the length of time after memory cells are programmed that bits of data stored in memory cells can be read without error. The magnitude of the programming signal and the length that the programming signal is applied to the memory cells can affect the data retention 462 characteristics of a memory device. For example, the voltage of the programming signal can be a particular magnitude such that the memory cell can be read over a period time despite voltage drift and/or disturb affecting reading of the data in the memory cells. Also, the length of the programming signal can be associated ensuring that programming operations are programming memory cells to the desired voltage to have desired data retention characteristics. Trim setting configurations can include setting the programming signal magnitude 471 and programming signal length 473 to affect data retention 462 characteristics in a memory device.

In FIG. 4, storage density 463 of a memory device can be associated with the number of bits per cell 476 and the number of programming signals in a programming operation 477. Storage density 463 of a memory device can include the number of bits stored per memory cell. A first portion of a memory device can store a first number of bits per memory cell and a second portion of a memory device can store a second number of bits per memory cell. Trim setting configurations that include setting the storage density 463 of a memory device can affect the programming speed of a memory device, the amount of data that can be stored on a memory device, and/or the power consumption of memory device, among other operational characteristics of a memory device. A memory device can include trim setting configurations that include the number of bits per memory cell 476 and the number of programming signals in a programming operation 477 to affect the storage density 463 of a memory device.

In FIG. 4, disturb 464 characteristics of a memory device can be associated with programming signal magnitude 470, sensing signal magnitude 471, erase signal magnitude 472, programming signal length 473, erase signal length, 474, sensing signal length 475, number of sensing signals in a sensing operation 478, number of programming signals in a programming operation 477, and number of bits per memory cell 476. Memory cells can be affected by other memory cells in a memory device. For example, the voltage of memory cell and how it was programmed to that voltage can affect the voltage of other memory cells. Also, how memory cells are sense and/or erased can affect the voltage of other memory cells. The effects of memory cells on each other in memory devices can be referred to as disturb characteristics 464 of the memory device due memory cells disturbing other memory cells. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, the number of programming signals in a programming operation 477, and the number of bits per memory cell 476 of a memory device to affect the disturb 464 characteristics of a memory device.

In FIG. 4, programming speed 465 of a memory device can be associated with the number of programming signals in a programming operation 477, allowable programming operation rate 479, programming signal magnitude 470, and the programming signal length 473. Trim setting configurations that include setting the programming speed 465 of a memory device can affect data retention in a memory device, the life span of a memory device, and/or the power consumption of memory device, among other operational characteristics of a memory device. A memory device can include trim setting configurations that include the number of programming signals in a programming operation 477, the allowable programming operation rate 479, the programming signal magnitude 470, and the programming signal length 473 to affect the programming speed 465 of a memory device.

In FIG. 4, power consumption 466 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Power consumption of 466 of a memory device can be affected by the voltage level that is being used to program, erase, and sense the memory cells, along with the duration and number of signals that are being used to program, erase, and sense the memory cells. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, the number of programming signals in a programming operation 477, of a memory device to affect the power consumption 466 of a memory device.

In FIG. 4, sensing speed 467 of a memory device can be associated with the number of sensing signals in a sensing operation 478, the sensing signal magnitude 471, and the sensing signal length 475. Trim setting configurations that include setting the sensing speed 467 of a memory device can affect the latency associated with performing read operations on a memory device. A memory device can include trim setting configurations that include the number of sensing signals in a sensing operation 478, the sensing signal magnitude 471, and the sensing signal length 475 to affect the sensing speed 467 of a memory device.

In FIG. 4, the temperature 468 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Memory cells can be affected by the temperature of memory device. For example, the temperature of memory device when memory cells are programmed and/or read can affect the signals used to program, erase, and sense the memory cells. Also, temperature of a memory device when data is programmed and/or read can affect data retention characteristics, the programming speed, sensing speed, power consumption, and life span of a memory device. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, and the number of programming signals in a programming operation 477 of a memory device to account for the temperature 468 of a memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a first array of memory cells; and
   a controller in a different geographic location than the first array of memory cells, wherein the controller communicates with the first array of memory cells via a communication channel and includes control circuitry to:
      receive operational characteristics of the first array of memory cells, wherein the operational characteristics are based on prior operations performed by the first array of the memory cells;
      determine a first set of trim settings for the first array of memory cells based on the operational characteristics of the first array of memory cells, wherein the first set of trim settings are associated with desired operational characteristics for the first array of memory cells; and
      send the first set of trim settings to the first array of memory cells.

2. The system of claim 1, including a second array of memory cells with the same operational characteristics as the first array of memory cells.

3. The system of claim 2, wherein the controller sends the first set of trim settings to the first array of memory cells and the second array of memory cells.

4. The system of claim 1, wherein the controller receives operational characteristics of a third array of memory cells and a fourth array of memory cells and determines a second set of trim settings for the third array of memory cells and the fourth array of memory cells.

5. The apparatus of claim 4, wherein the first set of trim settings are different from the second set of trim settings.

6. The apparatus of claim 4, wherein the controller sends the second set of trim settings to the third array of memory cells and the fourth array of memory cells.

7. The apparatus of claim 1, wherein the operational characteristics include programming speed for the first array of memory cells.

8. The apparatus of claim 1, wherein the operational characteristics include life span for the first array of memory cells.

9. A non-transitory computer-readable storage medium containing instructions that when executed cause a processor to:
   receive operational characteristics of an array of memory cells based on prior operations performed by the array of the memory cells at a controller in a different geographic location than the array of memory cells;
   determine, at the controller, a set of trim settings for the array of memory cells based on the operational characteristics of the array of memory cells, wherein the set of trim settings are associated with desired operational characteristics for the array of memory cells; and
   send the set of trim settings to the array of memory cells.

10. The medium of claim 9, further comprising instructions to receive manufacturing characteristics of the array of memory cells based on manufacturing data of the array of memory cells.

11. The medium of claim 10, further comprising instructions to set trim settings based on the manufacturing characteristics of the array of memory cells.

12. The medium of claim 9, further comprising instructions to send trim settings to a plurality of arrays of memory with the same prior operations performed as the array of memory cells.

13. The medium of claim 9, further comprising instructions to receive operational characteristics of the array of memory cells a second time after a particular period of time.

14. The medium of claim 13, further comprising determining a second set of trim settings for the array of memory cells at the second time and sending the trim settings to the array of memory cells.

15. A method, comprising:
   receiving operational characteristics of a first array of memory cells at a controller in a different geographic location than the first array of memory cells, wherein the operational characteristics are based on prior operations performed by the first array of memory cells;
   determining, at the controller, a first set of trim settings for the first array of memory cells based on the operational characteristics of the first array of memory cells, wherein the first set of trim settings are associated with desired operational characteristics for the first array of memory cells; and
   sending the first set of trim settings to the first array of memory cells.

16. The method of claim 15, further including receiving operational characteristics of a second array of memory cells, wherein the operational characteristics of the first array of memory cells and the operational characteristics of the second array of memory cells are similar.

17. The method of claim 16, further including sending the first set of trim settings to the second array of memory cells.

18. The method of claim 15, further including receiving operational characteristics of a third array of memory cells with different operational characteristics from the first array of memory cells.

19. The method of claim 18, further including determining a second set of trim settings for the third array of memory cells.

20. The method of claim 19, further including sending the second set of trim settings to the third array of memory cells.

* * * * *